US011417811B2

(12) United States Patent
Takenaga et al.

(10) Patent No.: US 11,417,811 B2
(45) Date of Patent: Aug. 16, 2022

(54) LIGHT EMITTING ELEMENT, LIGHT EMITTING DEVICE, AND METHOD FOR MANUFACTURING LIGHT EMITTING ELEMENT

(71) Applicant: NICHIA CORPORATION, Anan (JP)

(72) Inventors: Koichi Takenaga, Tokushima (JP); Takanori Fukumori, Tokushima (JP); Satoshi Shichijo, Tokushima (JP); Hiroki Fukuta, Anan (JP); Kunihito Sugimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 151 days.

(21) Appl. No.: 16/717,305

(22) Filed: Dec. 17, 2019

(65) Prior Publication Data

US 2020/0212278 A1 Jul. 2, 2020

(30) Foreign Application Priority Data

Dec. 28, 2018 (JP) .............................. JP2018-247571

(51) Int. Cl.
*H01L 33/62* (2010.01)
*H01L 33/32* (2010.01)
*H01L 33/44* (2010.01)
*H01L 33/38* (2010.01)
*H01L 33/60* (2010.01)
(Continued)

(52) U.S. Cl.
CPC ............ *H01L 33/62* (2013.01); *H01L 27/153* (2013.01); *H01L 33/0075* (2013.01);
(Continued)

(58) Field of Classification Search
CPC ....... H01L 33/382; H01L 33/38; H01L 33/20; H01L 2933/0016; H01L 33/62
See application file for complete search history.

(56) References Cited

U.S. PATENT DOCUMENTS 9,209,370 B2 * 12/2015 Kim ........................ H01L 33/10
9,887,334 B1 * 2/2018 Jeon ........................ H01L 33/44
(Continued)

FOREIGN PATENT DOCUMENTS

JP  2010-525586 A  7/2010
JP  2014-207267 A  10/2014
(Continued)

*Primary Examiner* — Bilkis Jahan
*Assistant Examiner* — Victor V Barzykin
(74) *Attorney, Agent, or Firm* — Global IP Counselors, LLP

(57) ABSTRACT

A light emitting element includes a semiconductor stacked body, an insulating film, first and second electrodes, a second external connection portion, and first external connection portions. The first semiconductor layer is exposed at a plurality of exposed portions disposed in a plurality of rows in plan view. The first external connection portions include at least one smaller-size first external connection portion disposed between adjacent ones of the rows other than the outermost one of the rows, and at least one larger-size first external connection portion extending from the end region, in which a spacing between a first outer edge of a second semiconductor layer and the exposed portions in the outermost one of the rows is narrower than a spacing between the exposed portions in adjacent ones of the rows, to at least a position between the outermost one of the rows and an adjacent one of the rows.

14 Claims, 12 Drawing Sheets

(51) Int. Cl.
*H01L 33/00* (2010.01)
*H01L 33/56* (2010.01)
*H01L 33/40* (2010.01)
*H01L 33/64* (2010.01)
*H01L 27/15* (2006.01)
*H01L 33/20* (2010.01)
*H01L 25/075* (2006.01)

(52) U.S. Cl.
CPC .............. *H01L 33/20* (2013.01); *H01L 33/32* (2013.01); *H01L 33/38* (2013.01); *H01L 33/382* (2013.01); *H01L 33/405* (2013.01); *H01L 33/44* (2013.01); *H01L 33/56* (2013.01); *H01L 33/60* (2013.01); *H01L 33/647* (2013.01); *H01L 25/0753* (2013.01); *H01L 2933/0016* (2013.01); *H01L 2933/0025* (2013.01)

(56) References Cited

U.S. PATENT DOCUMENTS

| | | | | |
|---|---|---|---|---|
| 10,903,407 | B2* | 1/2021 | Miki | H01L 33/38 |
| 2007/0085095 | A1* | 4/2007 | Ko | H01L 33/38 |
| | | | | 257/94 |
| 2008/0096297 | A1* | 4/2008 | Schiaffino | H01L 33/382 |
| | | | | 438/22 |
| 2009/0020769 | A1* | 1/2009 | Yoneda | H01L 33/382 |
| | | | | 257/88 |
| 2010/0117111 | A1 | 5/2010 | Tllek et al. | |
| 2014/0048838 | A1* | 2/2014 | Yang | H01L 27/156 |
| | | | | 257/99 |
| 2014/0110737 | A1* | 4/2014 | Matsumura | H01L 33/20 |
| | | | | 257/98 |
| 2015/0349207 | A1* | 12/2015 | Sogo | H01L 33/0093 |
| | | | | 257/99 |
| 2016/0043290 | A1 | 2/2016 | Sogo et al. | |
| 2016/0225956 | A1* | 8/2016 | Kawai | H01L 33/387 |
| 2017/0033262 | A1* | 2/2017 | Takenaga | H01L 33/20 |
| 2017/0141260 | A1* | 5/2017 | Chen | H01L 33/382 |
| 2017/0365738 | A1* | 12/2017 | Takenaga | H01L 33/382 |
| 2018/0182922 | A1* | 6/2018 | Emura | H01L 33/387 |
| 2018/0182929 | A1* | 6/2018 | Ozeki | H01L 33/50 |
| 2020/0350467 | A1* | 11/2020 | Lin | H01L 33/387 |

FOREIGN PATENT DOCUMENTS

| | | |
|---|---|---|
| JP | 2015-226038 A | 12/2015 |
| JP | 2016-009749 A | 1/2016 |
| JP | 2016-039324 A | 3/2016 |

* cited by examiner

LIGHT EMITTING ELEMENT, LIGHT EMITTING DEVICE, AND METHOD FOR MANUFACTURING LIGHT EMITTING ELEMENT

CROSS-REFERENCE TO RELATED APPLICATION

This application claims priority to Japanese Patent Application No. 2018-247571 filed on Dec. 28, 2018, the disclosure of which is hereby incorporated herein by reference in their entirety.

BACKGROUND

Conventional light emitting elements that have been proposed include a semiconductor structure having an n-type semiconductor layer, a light emitting layer stacked so as to expose part of the n-type semiconductor layer, and a p-type semiconductor layer; an insulating film having a plurality of openings provided on the semiconductor structure; n-electrodes connected through some of the plurality of openings, which are provided on the n-type semiconductor layer exposed from the light emitting layer and the p-type semiconductor layer; a p-electrode connected through some of the plurality of openings, which are provided on the p-type semiconductor layer; p-side external connections connected to the p-electrode; and n-side external connections connected to the n-electrodes (for example, in Japanese Laid-Open Patent Application Publication No. 2010-525586). A light emitting element such as this is configured as a light emitting device covered with light reflecting resin.

With this light emitting element, in order to increase both heat dissipation and light extraction efficiency, a plurality of plating layers are disposed over a wide range of the light emitting elements, spaced apart from each other so as to facilitate filling in with the light reflecting resin. However, since the portions of the n-type semiconductor layer exposed by the openings used for connecting with the n-electrodes are disposed at regular intervals, in the case where the plating layers are disposed over a wide area, the surface area of the plating layers located near the outer periphery of the light emitting element is smaller than the surface area of the rest of the plating layers. Therefore, there is less adhesion between the plating layers and the light emitting element, and there is the risk that the plating layers may peel off in the process of forming the plating layers. That is, in the step of removing the resist layer, which is performed in the lift-off of the plating layers, the plating layers sometimes end up being removed along with the resist layer.

SUMMARY

The present invention was conceived in light of this problem, and it is an object thereof to provide a light emitting element with which the plating layers will not peel off in the course of forming them, and both heat dissipation and light extraction efficiency can be increased, a light emitting device in which this light emitting element is used, as well as to provide a method for manufacturing this light emitting element.

The present disclosure includes the following aspects.

(1) A light emitting element includes a semiconductor stacked body, an insulating film, a first electrode, a second electrode, a second external connection portion, and a plurality of first external connection portions. The semiconductor stacked body has a first semiconductor layer, a light emitting layer stacked on the first semiconductor layer, and a second semiconductor layer stacked on the light emitting layer. On a second semiconductor layer side of the semiconductor stacked body, the first semiconductor layer is exposed from the second semiconductor layer and the light emitting layer at a plurality of exposed portions. The exposed portions are disposed in a plurality of rows in plan view with each of the rows extending in a first direction and the rows being aligned along a second direction perpendicular to the first direction. The semiconductor stacked body has an end region in which a spacing along the second direction between a first outer edge of the second semiconductor layer extending along the first direction and the exposed portions in an outermost one of the rows closest to the first outer edge of the second semiconductor layer is narrower than a spacing along the second direction between the exposed portions in adjacent ones of the rows. The insulating film covers the semiconductor stacked body and defines a plurality of openings respectively above the exposed portions. The first electrode is connected to the exposed portions at the openings in the insulating film. The first electrode is partly disposed over the second semiconductor layer via the insulating film. The second electrode is connected to the second semiconductor layer. The second external connection portion is connected to the second electrode. The first external connection portions are connected to the first electrode. The first external connection portions are spaced apart from the exposed portions in the plan view with each of the first external connection portions extending in the first direction between corresponding adjacent ones of the rows of the exposed portions. The first external connection portions include at least one smaller-size first external connection portion disposed between adjacent ones of the rows of the exposed portions other than the outermost one of the rows, and at least one larger-size first external connection portion extending from the end region to at least a position between the outermost one of the rows and an adjacent one of the rows the exposed portions. The larger-size first external connection portion has a larger surface area than the smaller-size first external connection portion in the plan view.

(2) A light emitting device includes a substrate having a wiring pattern on an upper surface, the light emitting element according to the above, the light emitting element being flip-chip mounted on the wiring pattern, and a cover member containing a light reflecting material, and covering the light emitting element, the first external connection portions, the second external connection portion and the substrate.

(3) A method for manufacturing a light emitting element includes: preparing a light emitting element portion including, a semiconductor stacked body having a first semiconductor layer, a light emitting layer stacked on the first semiconductor layer, and a second semiconductor layer stacked on the light emitting layer, on a second semiconductor layer side of the semiconductor stacked body, the first semiconductor layer is exposed from the second semiconductor layer and the light emitting layer at a plurality of exposed portions, the exposed portions being disposed in a plurality of rows in plan view with each of the rows extending in a first direction and the rows being aligned along a second direction perpendicular to the first direction, and the semiconductor stacked body having an end region in which a spacing along the second direction between a first outer edge of the second semiconductor layer extending along the first direction and the exposed portions in an outermost one of the rows closest to the first outer edge of the second semiconductor layer is narrower than a spacing along the second direction between the exposed portions in adjacent ones of the rows, an insulating film covering the semiconductor stacked body and defining a plurality of openings respectively above the exposed portions, a first electrode connected to the exposed portions at the openings in the insulating film, the first electrode being partly disposed over the second semiconductor layer via the insulating film, and a second electrode connected to the second semiconductor layer; forming a mask on the first electrode to cover all the exposed portions and to cover a region between adjacent ones of the exposed portions in each of the rows of the exposed portions except for the outermost one of the rows in the plan view; forming a conductive layer on the first electrode using the mask; and patterning the conductive layer by removing the mask to form a plurality of first external connection portions connected to the first electrode, the first external connection portions being spaced apart from the exposed portions in the plan view with each of the first external connection portions extending in the first direction between corresponding adjacent ones of the rows of the exposed portions, the first external connection portions including at least one smaller-size first external connection portion disposed between adjacent ones of the rows of the exposed portions other than the outermost one of the rows, and at least one larger-size first external connection portion extending from the end region to at least a position between the outermost one of the rows and an adjacent one of the rows the exposed portions, the at least one larger-size first external connection portion has a larger surface area than the at least one smaller-size first external connection portion in the plan view.

With the light emitting element, the light emitting device, and the method for manufacturing the light emitting element in an embodiment of the present invention, a light emitting element, and a method for manufacturing the same, can be provided with which there will be no peeling off of external connection portions in the course of forming the external connection portions in the manufacture of a light emitting device, and both heat dissipation and light extraction efficiency can be increased. Also, using a light emitting element such as this makes it possible to reliably provide a light emitting device in which both heat dissipation and light extraction efficiency are improved.

DETAILED DESCRIPTION

Figure 1A:
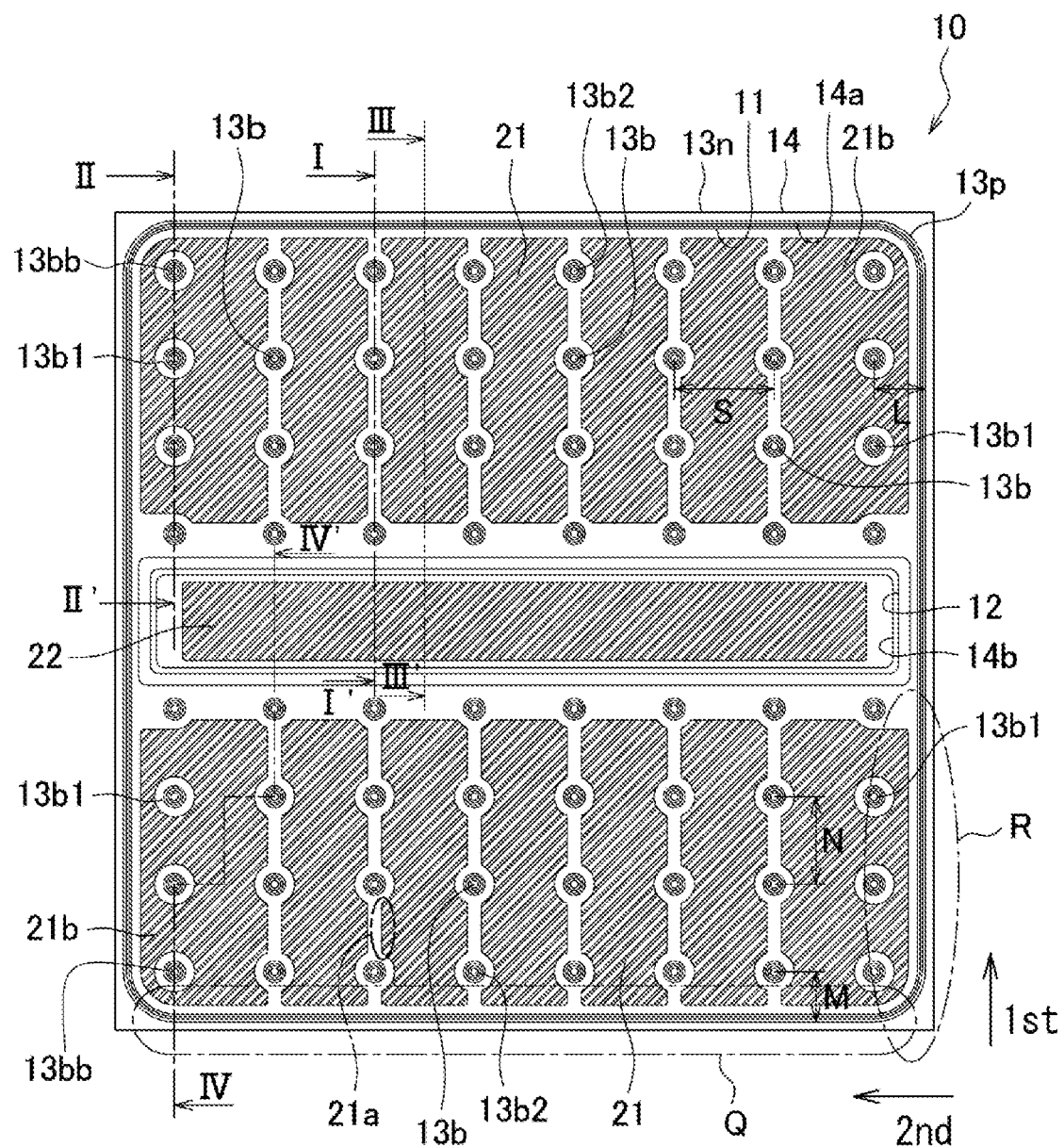
FIG. 1A is a plan view schematically showing the light emitting element according to an embodiment of the present disclosure.
Figure 1B:
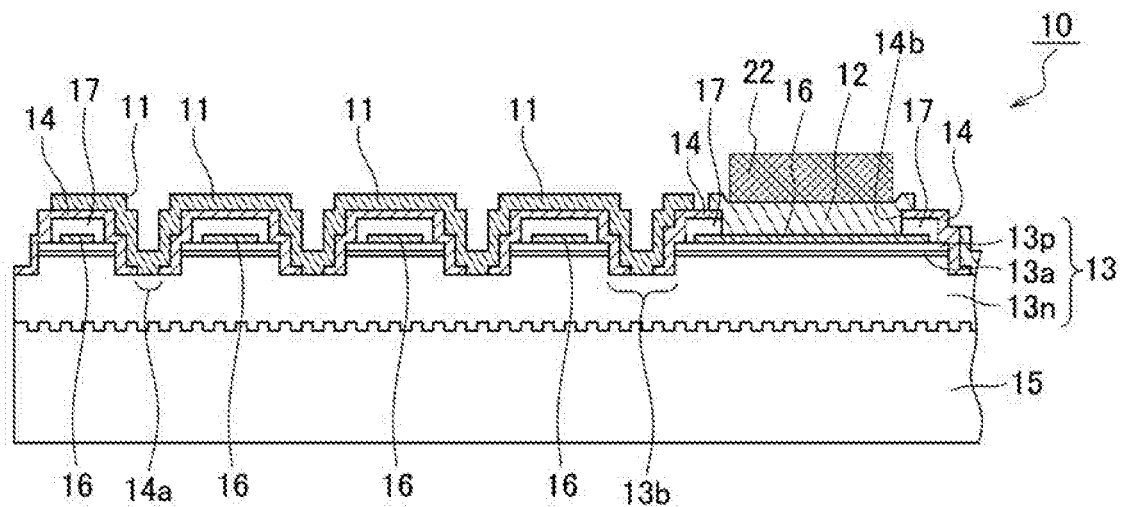
FIG. 1B is a cross-sectional view schematically showing the light emitting element taken along line I-I' in FIG. 1A.

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate. In FIG. 1A and FIGS. 3A to 5B, hatched areas indicate areas where the first external connection portions 21 and the second external connection portion 22 are disposed.

In the present application, "first direction" means a direction parallel to any one side of a semiconductor stacked body 13 or a light emitting element 10. "Second direction" means a direction perpendicular to the first direction. "In the first direction" or "along the first direction" means parallel or substantially parallel to the first direction. "In the second direction" or "along the second direction" means parallel or substantially parallel to the second direction.

Embodiment 1: Light Emitting Element 10

As shown in FIGS. 1A to 1D, the light emitting element 10 in an embodiment of the present disclosure includes a semiconductor stacked body 13 having a first semiconductor layer 13n, a light emitting layer 13a, and a second semiconductor layer 13p, in that order; an insulating film 14 that covers the side surfaces and the top surface of the semiconductor stacked body 13; first electrodes 11 that are connected to first semiconductor layer 13n and are disposed on second semiconductor layer 13p; a second electrode 12 that is connected on the second semiconductor layer 13p; first external connection portions 21 that are connected to the first electrode 11; and a second external connection portion 22 that is connected to the second electrode 12.

The semiconductor stacked body 13 has a plurality of exposed portions 13b where the first semiconductor layer 13n is exposed from the second semiconductor layer 13p and the light emitting layer 13a. The exposed portions 13b are disposed in a plurality of rows in the first direction in plan view. The semiconductor stacked body 13 has at least one region R (one example of the end region) in which the spacing L along the second direction between the outer edge (the first outer edge) of the second semiconductor layer 13p extending in the first direction and the exposed portions 13b1 closest to the outer edge of the second semiconductor layer extending in the first direction in plan view is narrower than the spacing S along the second direction between the exposed portions 13b that are adjacent in the second direction. In the example shown in FIG. 1A, four regions R are provided at the top-left, top-right, bottom-left and bottom-right portions of the semiconductor stacked body 13.

The insulating film 14 has openings 14a above the plurality of exposed portions 13b.

The first electrodes 11 are connected to the exposed portions 13b through the openings 14a, and are partly disposed on the second semiconductor layer 13p via the insulating film 14.

A plurality of the first external connection portions 21 are provided, and are disposed in plan view in between the rows of the exposed portions 13b in the first direction and away from the exposed portions 13b. The first external connection portions include first external connection portions 21b (one example of the larger-size first external connection portion) that extend in plan view from the region R of the semiconductor stacked body, in between the rows of the exposed portions 13b running in the first direction, and have a larger surface area than the first external connection portions 21 (the smaller-size first external connection portion) other than the first external connection portions 21b.

The light emitting element 10 has a structure suited to flip-chip mounting, in which the mounting surface is on the side on which the first electrodes 11 and the second electrode 12, the first external connection portions 21, and the second external connection portion 22 are provided. The surface on the opposite side from the mounting surface here is the main light extraction surface.

Examples of the planar shape of the light emitting element 10 include tetragonal, hexagonal, and other such polygonal shapes, these shapes in which the corners have been rounded, circular, and elliptical. Of these, a tetragonal shape is preferable.

With this light emitting element, both heat dissipation and light extraction efficiency can be improved, while allowing a high-quality light emitting element to be manufactured without causing any peeling of the plating layers in the course of forming the plating layers in the manufacture of the light emitting element.

Semiconductor Stacked Body 13

The semiconductor stacked body 13 constituting the light emitting element 10 is configured by stacking the first semiconductor layer 13n, the light emitting layer 13a, and the second semiconductor layer 13p in that order. This semiconductor stacked body 13 is usually formed on an insulating support substrate 15. However, in the end, the support substrate 15 may be removed from the light emitting element 10. The light emitting layer 13a and the second semiconductor layer 13p that is provided on the upper surface of the light emitting layer 13a are provided in a specific region of the upper surface of the first semiconductor layer 13n. That is, the second semiconductor layer 13p and the light emitting layer 13a are not present in some regions on the first semiconductor layer 13n. The regions where the first semiconductor layer 13n is thus exposed from the light emitting layer 13a and the second semiconductor layer 13p shall be referred to as the exposed portions 13b.

That is, the semiconductor stacked body 13 has a plurality of holes spaced apart from each other in plan view on the surface of the second semiconductor layer 13p, and the first semiconductor layer 13n is exposed at the bottom surface of the holes. The side surfaces of the second semiconductor layer 13p, the side surfaces of the light emitting layer 13a, and the side surfaces of the first semiconductor layer 13n are exposed at the side surfaces of the holes.

The exposed portions 13b are preferably disposed regularly in one light emitting element. More specifically, the exposed portions 13b are preferably disposed in a plurality of rows in the first direction. It is also preferable for at least a few rows of the exposed parts 13b to be disposed in the second direction as well. Of the exposed portions 13b disposed in the first direction, those closest to the outer edge in the first direction will sometimes be referred to as the exposed portions 13b1. Of the exposed portions 13b disposed in the second direction, those closest to the outer edge in the second direction will sometimes be referred to as the exposed portions 13b2. For example, from a few rows to ten or more rows of the exposed portions 13b are preferably disposed in the second direction. It is especially favorable for the exposed portions 13b disposed in rows in the first direction to be disposed in three or more rows so as to be adjacent to each other. This makes it easier to supply electric current over a wide range of the light emitting element. There are no particular restrictions on the number of exposed portions 13b aligned in the first direction. For example, it is favorable for the number of rows in the first direction of the exposed portions 13b disposed in rows to be less than the number of exposed portions 13b disposed in one row. This allows the first external connection portions (discussed below) to be formed in a larger surface area in between the rows of the exposed parts 13b running in the second direction.

The shape and size of the exposed portions 13b can be appropriately set depending on the size, shape, electrode pattern, and so forth of the light emitting element.

Examples of the plan view shape of the exposed portions 13b include circular, elliptical, and polygonal, such as triangular, quadrangular, and hexagonal, with circular or an elliptical shape close to circular being preferable. The size of the exposed portions 13b in plan view can be appropriately adjusted according to the size of the semiconductor stacked body 13, the required output and luminance of the light emitting element, and the like. For instance, the diameter of an exposed portion 13b is preferably from several tens of microns to several hundred microns. Looked at another way, the diameter of an exposed portion 13b is preferably about $1/20$ to $1/5$ of one side of the semiconductor stacked body.

The plurality of exposed portions 13b may all have substantially the same planar shape and substantially the same size (surface area), or some or all of them may have different shapes and sizes. Since the exposed portions 13b are regions where there is no light emitting layer 13a, unevenness in the emission surface area and the current supply amount can be suppressed by regularly arranging a plurality of exposed portions 13b of the same size. The result is that luminance unevenness can be reduced for the light emitting element as a whole. The surface area referred to herein means the area in plan view.

The plurality of exposed portions 13b are preferably formed to the inside of the outer edge of the semiconductor stacked body 13. Also, it is preferable for the total surface area of the part of the exposed portions 13b disposed to the inside of the outer edge of the semiconductor laminated body 13 to be no more than 30% of the surface area of the semiconductor laminated body 13, with 20% or less being more preferable, and 15% or less better yet. Setting the range over which the exposed portions 13b are disposed to the inside of the outer edge of the semiconductor stacked body 13 to no more than 30% of the surface area of the semiconductor stacked body 13 allows for a good balance of current supply to the first semiconductor layer 13n and the second semiconductor layer 13p, and reduces luminance unevenness caused by a bias in the supplied power.

The exposed portions 13b are preferably disposed regularly. More specifically, it is preferable for the exposed portions 13b to be disposed substantially equidistantly in plan view. This reduces luminance unevenness in the light emitting element and allows light to be extracted uniformly. More specifically, the exposed portions 13b are substantially circular in plan view. The size of the exposed portions 13b, for example, is preferably from several tens of microns to several hundred microns in diameter, and the exposed portions 13b are preferably arranged in regularly spaced rows on the upper surface side.

In particular, as shown in FIG. 1A, the semiconductor stacked body 13 preferably has a region R in plan view in which the distance L in the second direction between the exposed portions 13b1 closest to the outer edge in the first direction and the outer edge of the second semiconductor layer 13p in the first direction is shorter than the distance S between adjacent exposed portions 13b in the second direction. The distance S between the exposed portions 13b here indicates the distance between the approximate centers of adjacent exposed portions 13b. Similarly, the semiconductor stacked body 13 preferably has at least one region Q (two regions Q are provided in the example shown in FIG. 1A) in which the distance M in the first direction between the exposed portions 13b2 closest to the outer edge in the second direction and the outer edge of the second semiconductor layer in the second direction is shorter than the distance N between adjacent exposed portions 13b in the first direction. With a layout such as this, a good balance is struck between the supply of current to the first semiconductor layer 13n and the second semiconductor layer 13p, and luminance unevenness caused by a bias in the supplied power can be further suppressed.

Examples of the distance M or the distance L are 20% to 90% of the distance N or the distance S, respectively, preferably 40% to 80% and more preferably 30% to 75%. Also, either the distance L or the distance M may be larger than the other, but they are preferably the same or substantially the same. Similarly, either the distance N and the distance S may be larger than the other, but they are preferably the same or substantially the same distance (e.g., ±10% of one distance).

Examples of the semiconductor stacked body 13 include various semiconductors such as a III-V group compound semiconductor and a II-VI group compound semiconductor. Specifically, $In_XAl_YGa1_{-X-Y}N$ ($0 \leq X$, $0 \leq Y$, and $X+Y \leq 1$) and the like such as InN, AlN, GaN, InGaN, AlGaN, InGaAlN and the like can be used. As the film thickness and layer structure of each layer, those known in the art can be used.

Insulating Film 14

The insulating film 14 covers the upper surface and side surfaces of the semiconductor stacked body 13, and has openings 14a above the exposed portions 13b. Preferably, it has an opening 14b above the second semiconductor layer 13p. Because the insulating film 14 covers the semiconductor stacked body 13 and has the openings 14a above the exposed portions 13b, the first electrodes 11 can be formed over a wide area on the upper surface of the insulating film 14 covering the upper surface of the second semiconductor layer 13p, such as substantially the entire upper surface of the insulating film 14.

The insulating film 14 is preferably formed from a material known in this field, and from a material and in a thickness with which electrical insulation can be ensured. Specifically, the insulating film 14 may be formed of at least one kind of oxide or nitride selected from the group consisting of metal oxide and metal nitride, for example, Si, Ti, Zr, Nb, Ta, Al and the like.

First Electrodes 11 and Second Electrode 12

The first electrodes 11 and the second electrode 12 are disposed on the upper surface side of the semiconductor stacked body 13 (that is, the second semiconductor layer side, which is on the opposite side from the growth substrate).

The first electrodes 11 are connected to the exposed portions 13b through the openings 14a in the insulating film 14 above the exposed portions 13b. In this case, the first electrodes 11 are preferably connected so as to cover a plurality of exposed portions 13b. For example, half of the exposed portions 13b may be covered and integrally connected by one first electrode 11. It is even better if a first electrode 11 covers a plurality of exposed portions 13b and is integrally connected to the exposed portions 13b. Therefore, the first electrodes are disposed not only on the first semiconductor layer 13n, but also above the second semiconductor layer 13p. Here, the first electrodes 11 are disposed on the second semiconductor layer 13p and on the side surfaces of the hole forming the exposed portions 13b (that is, the side surfaces of the light emitting layer 13a and the second semiconductor layer 13p), with the insulating film 14 interposed in between.

The second electrode 12 is disposed on the second semiconductor layer 13p and electrically connected to the second semiconductor layer 13p through the opening 14b in the insulating film 14 above the second semiconductor layer 13p.

The first electrodes 11 and the second electrode 12 may not be in direct contact with the first semiconductor layer 13n and the second semiconductor layer 13p, respectively, and may be electrically connected via a conductive member such as a light reflective electrode (discussed below).

The first electrode 11 and the second electrode 12 can be formed of, for example, a single layer film or a staked film of a metal such as Au, Pt, Pd, Rh, Ni, W, Mo, Cr, Ti, Al, Cu or an alloy thereof. Specifically, these electrodes may include Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, Ti/Rh from the semiconductor layer side. The film thickness of the first electrode 11 and the second electrode 12 may be any film thickness used in this field.

As for the plan view shapes of the first electrodes 11 and the second electrode 12, in the case that the plan view shape of the semiconductor stacked body is rectangular, it is preferable for the outer edge shapes of these also to be rectangular or substantially rectangular. The first electrodes 11 and the second electrode 12 are preferably disposed alternately and in parallel in one direction in a single semiconductor stacked body in plan view. For instance, the first electrodes 11 are preferably disposed so as to sandwich the second electrode 12 in plan view.

Light Reflective Electrodes 16

The light emitting element 10 may have light reflective electrodes 16 between the first electrodes 11 and/or the second electrode 12 and the second semiconductor layer 13p.

Silver, aluminum, or an alloy whose main component is one of these metals can be used as the light reflective electrode 16, and silver or a silver alloy having high light reflectivity with respect to the light emitted by the light emitting layer is particularly favorable. The light reflective electrodes 16 preferably are thick enough to be able to effectively reflect the light emitted from the light emitting layer, such as a thickness of from 20 nm to 1 µm. The light reflective electrodes 16 are preferably disposed over a wide range of the semiconductor stacked body 13. More specifically, the combined surface area of the light reflective electrodes 16 may be 50% or more, 60% or more, or 70% or more of the surface area of the semiconductor stacked body 13.

In the case where the light reflective electrodes 16 contain silver, a protective film 17 that covers the upper surface, and preferably the upper surface and side surfaces, of the light reflective electrode 16 may be provided to prevent silver migration. The protective film 17 may be formed from a conductive member, such as metals or alloys that are normally used as electrode materials, or may be formed using an insulating member. Examples of the conductive member include a single layer or stacked layers containing aluminum, copper, nickel, or another such metal. Examples of the insulating member include the same materials as for the insulating film 14 mentioned above, but the use of SiN is preferable. Since SiN is a dense film, it is excellent as a material for suppressing the intrusion of moisture. The thickness of the protective film 17 can be anywhere from a few hundred nanometers to a few microns in order to effectively prevent silver migration. In the case where the protective film 17 is formed by an insulating member, the light reflective electrodes 16 and the second electrode 12 can be electrically connected because the protective film 17 has openings above the light reflective electrodes 16. In the case where the light emitting element 10 has the light reflective electrodes 16 and the protective film 17 on the second semiconductor layer 13p, the insulating film 14 covering the semiconductor stacked body 13 covers the light reflective electrodes 16 and the protective film 17, and an opening is formed in the region directly below the second electrode 12, so that the second electrode 12 and the light reflective electrodes 16 are electrically connected.

First External Connection Portions 21 and Second External Connection Portion 22

The first external connection portions 21 and the second external connection portion 22 are electrically connected to the first electrodes 11 and the second electrode 12, respectively, and are provided in order to make external connections.

The first external connection portions 21 are connected to the first electrodes 11 and are provided on the first electrodes 11 provided on the upper surface of the insulating film 14 above the second semiconductor layer 13p. In plan view, these first external connection portions 21 are disposed away from the exposed portions 13b. The first external connection portions 21 are disposed in between the rows of the exposed portions 13b arranged in the first direction, and a plurality of them are disposed in the second direction. The first external connection portions 21 have a shape that is longer in the first direction. The length of the first external connection portions 21 in the first direction is slightly shorter than one-half the length of the semiconductor stacked body 13 in the first direction. More specifically, the length of the first external connection portions 21 in the first direction may be between 35% and 45% the length of the semiconductor stacked body 13 in the first direction. The first external connection portions 21 are preferably disposed one by one in between the rows of the exposed portions 13b arranged in the second direction.

The first external connection portions 21 include first external connection portions 21b that are disposed so as to surround the exposed portions 13b1 adjacent to the outer edge of the second semiconductor layer 13p in the first direction in plan view. The first external connection portions 21b extend from the above-mentioned region R of the semiconductor stacked body 13 to between the rows of the exposed portions 13b and the exposed portions 13b1 arranged in the first direction, and the surface area is larger than that of the first external connection portions 21 disposed in between the rows of the exposed portions 13b. As shown in FIG. 1A, in plan view the first external connection portions 21 include the first external connection portions 21b that extend from the region R, in which the distance L in the second direction between the exposed portions 13b1 closest to the outer edge in the first direction and the outer edge of the second semiconductor layer 13p in the first direction is shorter than the distance S between adjacent exposed portions 13b in the second direction, to in between the rows of the exposed portions 13b and the exposed portions 13b1 arranged in the first direction. These first external connection portions 21b have a larger surface area than the first external connection portions 21 disposed in between the rows of the exposed portions 13b.

Thus increasing the surface area of the first external connection portions 21b disposed at the end of the first external connection portions 21 (for example, the end in the second direction) prevents plating layer separation in the course of forming the plating layers in the manufacture of the light emitting element, and allows first external connection portions having the specified shape to be reliably formed. As a result, both heat dissipation and light extraction efficiency can be improved in the light emitting device.

The first external connection portions 21 also have extensions 21a that extend in the second direction in plan view. It is preferable for at least part of the extensions 21a to be disposed between the exposed portions 13b adjacent in the first direction in plan view. This allows the first external connection portions 21 to be made larger in plan view. The width of the extensions 21a (that is, their length in the first direction) is set so that the extensions 21a will be close to the exposed portions 13b in between the exposed portions 13b, without causing any electrical short circuiting. A plurality of the extensions 21a are disposed in a single first external connecting portion 21, and some or all of them may have different sizes and shapes, but preferably at least at the edges extending in the same direction are the same size.

As shown in FIG. 1A, with respect to the exposed portions 13b1 and 13b2 adjacent to the outer edges of the light emitting element 10, the first external connection portions 21 and 21b preferably have ends that are closer to the outer edges than the ends of the exposed portions 13b1 and 13b2. In other words, the extensions 21a preferably extend beyond the exposed portions 13b2 in the first direction, in between the exposed portions 13b2 that are arranged closest to the outer edge of the semiconductor stacked body 13, out of the exposed portions 13b disposed in rows in the first direction.

Also, in the case where the exposed portions 13b are disposed in a plurality of rows along the second direction, the light emitting element 10 preferably has a plurality of the first external connection portions 21, and the plurality of first external connection portions 21 are disposed one by one in between the rows. That is, it is preferable for two or more of the first external connection portions 21 disposed between the rows to be disposed apart from each other and sandwiching the exposed portions 13b disposed in a row. Because the first external connection portions 21 comprise the extensions 21a that extend between the exposed portions 13b that are adjacent along the first external connection portions 21, the first external connection portions 21 can be formed in a larger surface area.

Because the first external connection portions 21 formed elongated along the first direction thus have the extensions 21a that extend in the second direction in plan view, the first external connection portions 21 can be disposed over a larger surface area, away from the exposed portions 13b on the semiconductor stacked body 13. Since the first external connection portions 21 and the exposed portions 13b do not overlap in plan view, in joining the light emitting element 10 to the substrate 23 (discussed below), damage to the insulating film and electrodes near the exposed portions 13b caused by stress during this joining can be avoided. Also, since the first external connection portions 21 can be disposed over a large surface area on one surface of the light emitting element 10, even better heat dissipation can be ensured. In addition, as described above, if two or more first external connection portions 21 having a shape that is longer in the first direction are disposed apart from each other and sandwiching the exposed portions 13b disposed in a row, the uncured resin material used to form a cover member 27 (discussed below) will flow more easily in the formation of the cover member 27. This makes it less likely that voids or the like will be produced directly under the light emitting element 10. That is, the first external connection portions 21 have a shape that is longer in the first direction between the rows of the exposed portions 13b disposed in a plurality of rows in the first direction, which means that the uncured resin material used to form the cover member 27 will flow more easily in the first direction directly below the exposed portions 13b. Consequently, the resin material can be more easily disposed inside the holes forming the exposed portions 13b, and voids will be less likely to occur directly below the exposed portions 13b (that is, inside the holes forming the exposed portions).

In the case where the first external connection portions 21 are adjacent to each other and sandwich the exposed portions 13b, the closest distance between the first external connection portions 21 is, for example, 0.1% to 2% of the length of one side of the light emitting element 10.

The second external connection portion 22 is connected to the second electrode 12. The second external connection portion 22 has, for example, a shape that is narrower in the second direction, and has a length that is 5% to 20% of the length of the semiconductor stacked body 13 in the first direction, and a length that is somewhat shorter than the semiconductor stacked body 13 in the second direction.

The second external connection portion 22 is preferably disposed so as to be sandwiched between first external connection portions 21 extending in the first direction, for example. That is, in plan view, preferably the second external connection portion 22 is elongated in the second direction, and the first external connection portions 21 are disposed sandwiching the second external connection portion 22. In this case, the first external connection portions 21 are more preferably disposed in line symmetry with respect to the center line along the second direction of the second external connection portion 22. This reduces the stress bias to which the first external connection portions 21 and the second external connection portion 22 are subjected in flip-chip mounting of the light emitting element 10 on the substrate 23. As a result, the joining accuracy between the light emitting element 10 and the substrate 23 is stabilized. Also, since the second external connection portion 22 is disposed at a distance from the first external connection portions 21 that is the same as the spacing at which the first external connection portions 21 are disposed in the second direction, the fluidity of the uncured resin material that forms the cover member 27 can be improved over the entire light emitting element. Consequently, the generation of voids in the region of the light emitting element 10 where the cover member 27 is disposed can be effectively prevented, and a reduction in thermal stress can be achieved.

The combined surface area of the first external connection portions 21 and the second external connection portion 22 in plan view is preferably about 40% to 80%, and more preferably about 50% to 70%, with respect to the surface area of the semiconductor stacked body 13. Setting the combined surface area of the first external connection portions 21 and the second external connection portion 22 to at least 40% with respect to the surface area of the semiconductor stacked body 13 improves the heat dissipation of the light emitting element. Setting the combined surface area of the first external connection portions 21 and the second external connection portion 22 to no more than 80% with respect to the surface area of the semiconductor stacked body 13 helps ensure a region in which the uncured resin material for forming the cover member 27 can flow.

The first external connection portions 21 and the second external connection portion 22 can each be formed by a well-known method in this field. For example, a sputtering method, a vapor deposition method, a plating method, a method combining thereof, or the like can be used. For example, in the case of forming the first external connection portions 21 and the second external connection portion 22, a single layer or a stacked layer of metals, such as Al, Ag, Al alloy and Ag alloy, Cu, Au, Ni, can be used. The first external connection portions 21 and the second external connection portion 22 are preferably formed at least the uppermost layer with Au in order to prevent corrosion and improve the bondability with the substrate 23 using an Au alloy-based adhesive member such as Au—Sn eutectic solder.

Embodiment 2: Method for Manufacturing Light Emitting Element 10

The manufacture of the light emitting element 10 described above involves first preparing a light emitting element portion, then forming a mask of a specific shape on the light emitting element portion, using this mask to form a conductive layer, and patterning the conductive layer to form the first external connection portions and the second external connection portion. This manufacturing method may further include a step of dividing into individual light emitting elements, or into a plurality of light emitting element groups, at a certain stage, for example.

Preparation of Light Emitting Element

Figure 2A:
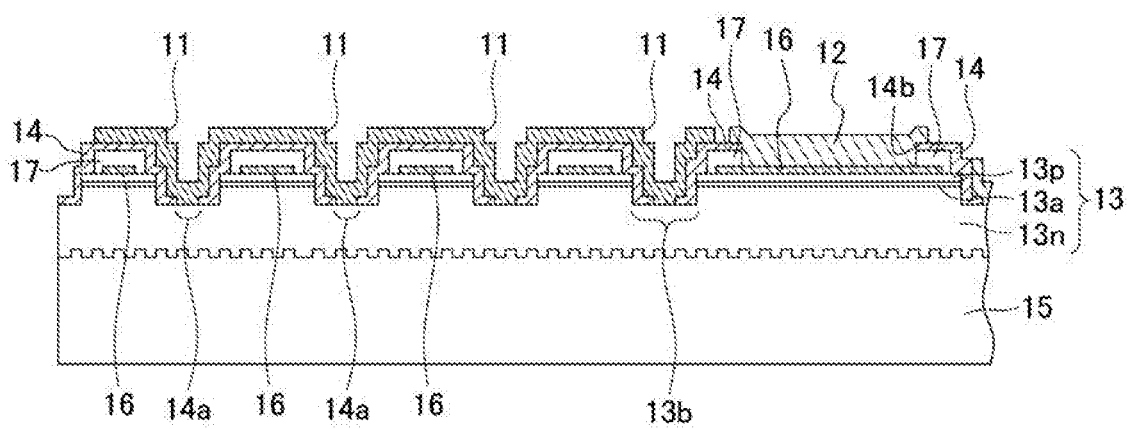
FIG. 2A is a cross-sectional view schematically showing the method for manufacturing the light emitting element taken along line IV-IV' in FIG. 1A.

First, as shown in FIG. 2A, the light emitting element portion constituting the light emitting element is prepared. More specifically, the light emitting element portion has the semiconductor stacked body 13, the insulating film 14, the first electrodes 11, and the second electrode 12. The light emitting element portion may be configured such that, for example, the semiconductor stacked body 13 constituting one light emitting element is disposed on an insulating support substrate 15, or a plurality may be disposed in a matrix on the support substrate 15 (a wafer or the like). FIG.

2A shows only a part of the light emitting element portion corresponding to a cross section along the IV-IV' line in FIG. 1A.

As described above, the light reflective electrodes 16 and the protective film 17 covering the light reflective electrodes 16 may be disposed on the second semiconductor layer 13p. In this case, the first electrodes 11 are disposed on the second semiconductor layer 13p via the light reflective electrodes 16, the protective film 17, and the insulating film 14.

The insulating film 14 in the light emitting element portion preferably further has an opening 14b over the second semiconductor layer 13p.

Formation of Mask 56

Figure 2B:
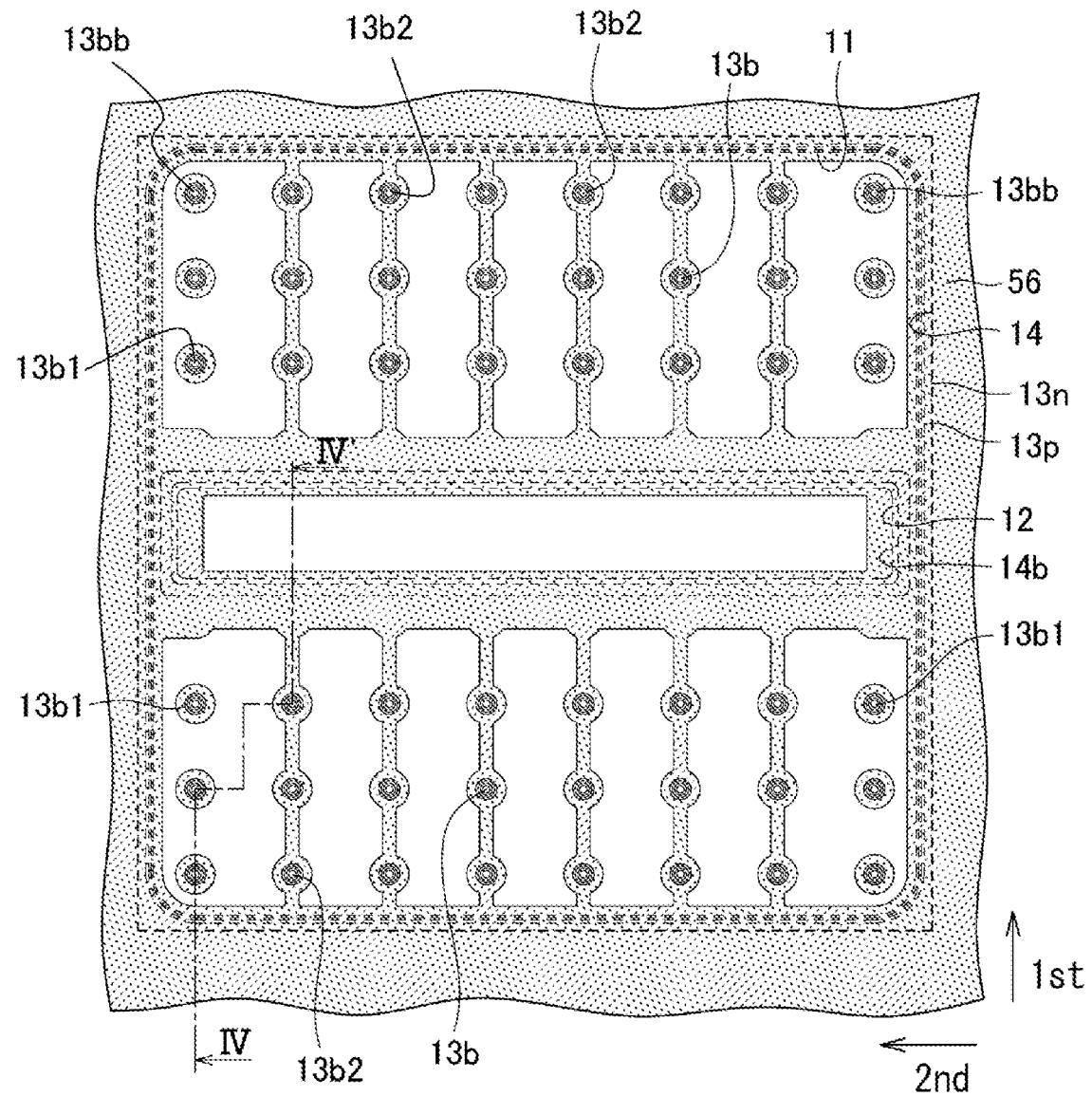
FIG. 2B is a plan view schematically showing the method for manufacturing the light emitting element shown in FIG. 1A.
Figure 2C:
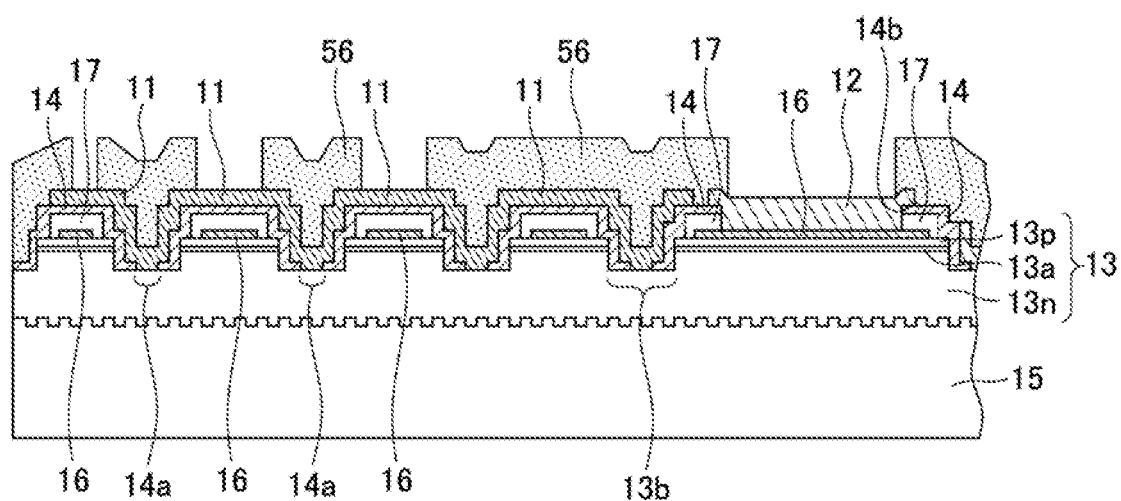
FIG. 2C is a cross-sectional view schematically showing the light emitting element taken along line IV-IV' in FIG. 2B.

As shown in FIGS. 2B and 2C, a mask material is formed on the first electrodes 11 and the second electrode 12, and this mask material is patterned into a specific shape by photolithography and etching steps to form the mask 56. The plan view shape of the mask 56 here is such that it covers the region connecting the exposed portions 13b other than the exposed portions 13b1 closest to the outer edge in the first direction of the second semiconductor layer 13p in the first direction, and the exposed portions 13b. The mask 56 is preferably formed so as to further cover in the first direction a region extending in the second direction (that is, the region adjacent to the outer edge in the second direction), in a width that is less than the width of the exposed portions 13b in plan view.

This mask 56 is preferably formed to further cover the outer edge of the second electrode 12 and the region adjacent thereto, and the region linking the exposed portions 13b adjacent to the second electrode 12. Forming such a mask 56 allows the second external connection portion 22 to be formed simultaneously with the first external connection portions 21.

The mask 56 preferably also covers the outer peripheral portion of the first electrodes 11 including the outer edge of the second semiconductor layer 13p from the outer edge of the light emitting element portion. Masking this region prevents short circuiting due to the conductive layer 57 on the side surfaces of the light emitting element portion.

Formation of Conductive Layer 57

Figure 2D:
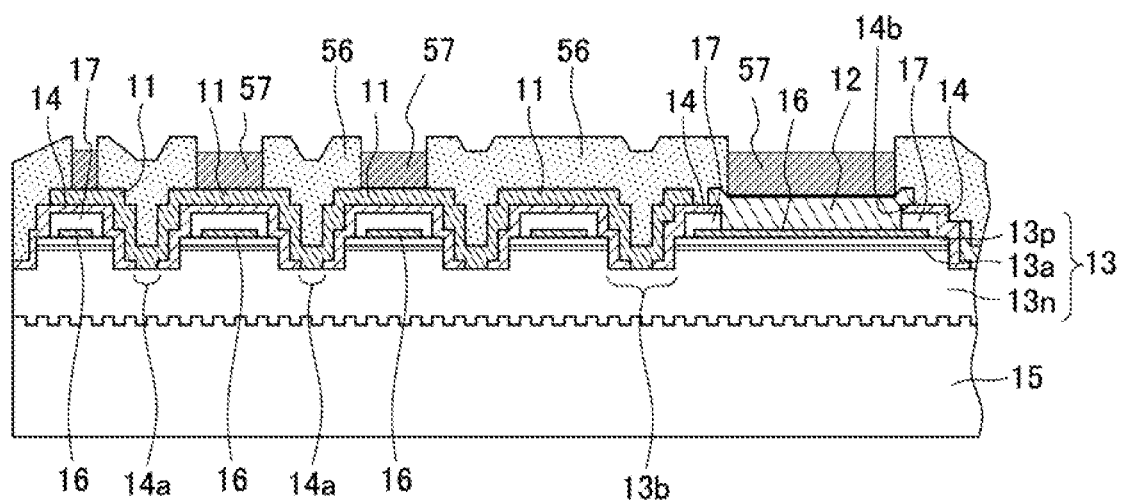
FIG. 2D is a cross-sectional view schematically showing the method for manufacturing the light emitting element taken along line IV-IV' in FIG. 2B.

A conductive layer 57 is formed on at least the first electrodes 11 using the mask 56. In this case, the conductive layer 57 is preferably also formed on the second electrode 12. That is, as shown in FIG. 2D, the conductive layer 57 is preferably formed on the upper surfaces of the first electrodes 11 and the second electrode 12.

The conductive layer 57 can be formed by any method known in this field, but this preferably includes a step of forming by plating. Also, it is more preferable to include a step of forming the outermost surface of the conductive layer 57 by plating, and it is even more preferable to form the conductive layer 57 by plating alone.

Formation of First External Connection Portions 21 and Second External Connection Portion 22

Figure 1C:
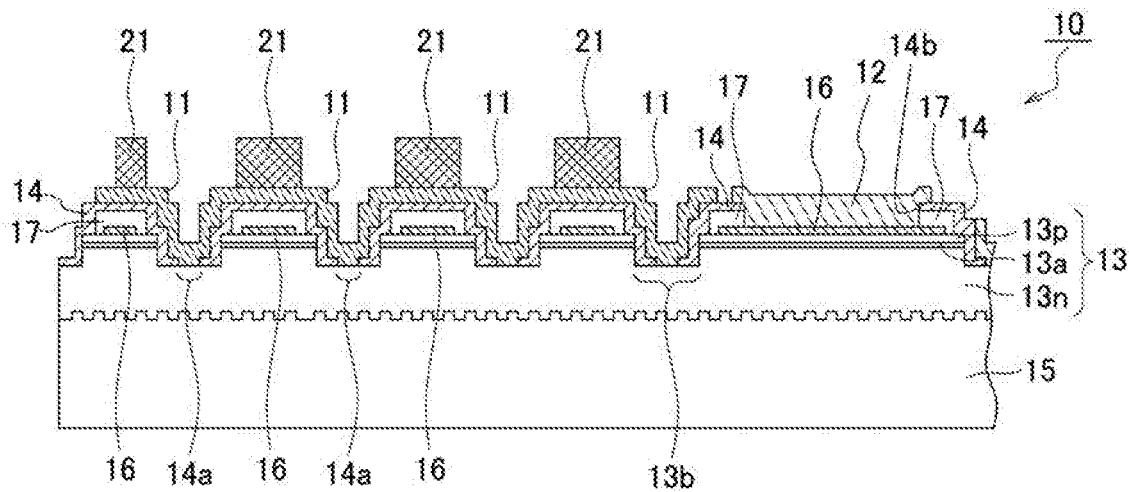
FIG. 1C is a cross-sectional view schematically showing the light emitting element taken along line II-II' in FIG. 1A.
Figure 1D:
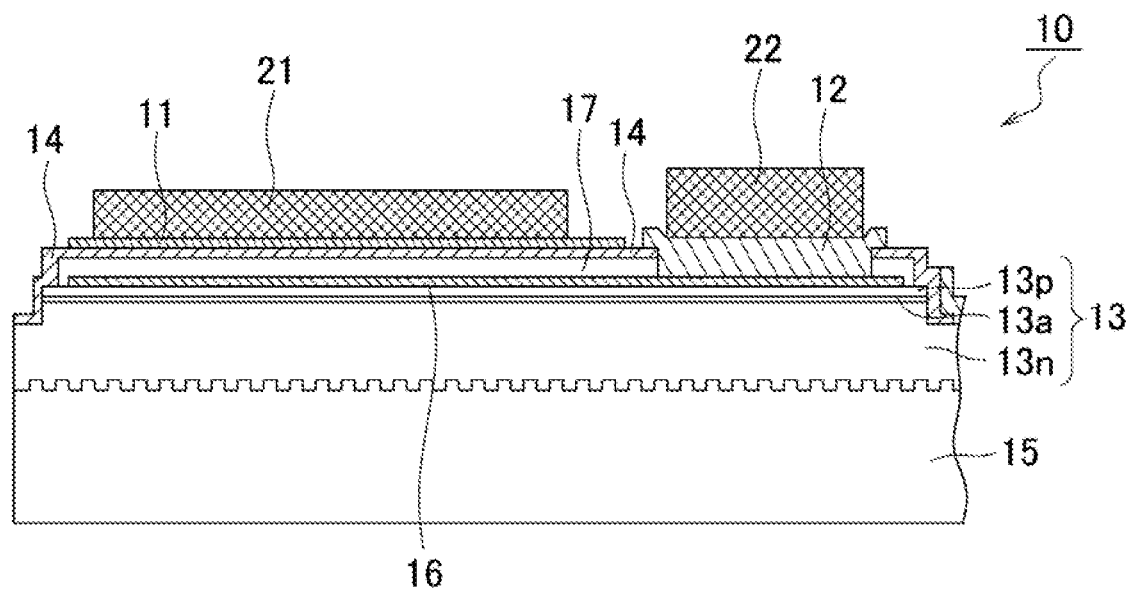
FIG. 1D is a cross-sectional view schematically showing the light emitting element taken along line III-III' in FIG. 1A.

After the conductive layer 57 is formed, the mask 56 is removed. For instance, it is preferable to remove the mask 56 by lift-off method. Consequently, the conductive layer 57 disposed on the mask 56 is removed along with the mask 56, so the conductive layer 57 is patterned into a specific shape, and the first external connection portions 21 can be formed as shown in FIGS. 1C and 1D. The first external connection portions 21 obtained here can be formed as a plurality of first external connection portions 21 that are connected to the first electrodes 11 and are disposed in between the rows of the exposed portions 13b arranged in the first direction, away from the exposed portions 13b, in plan view, and first external connection portions 21b. The first external connection portions 21b extend from the region R of the semiconductor stacked body 13 (see FIG. 1A) to between the rows of the exposed portions 13b and the exposed portions 13b1 arranged in the first direction in plan view. The first external connection portions 21b have a larger surface area than the first external connection portions 21 disposed in between the rows of the exposed portions 13b.

Thus, with this embodiment, the exposed portions 13b in one light emitting element portion are uniformly disposed within the plane of the semiconductor stacked body 13, and even if the distance is short between the outer edge of the semiconductor stacked body 13 and the exposed portions 13b closest thereto, the surface area of the first external connection portions 21 will be unlikely to be partially reduced. In the course of forming the external connection portions in the light emitting element manufacturing process, by making the surface area of the first external connection portions 21b located near the outer periphery of the light emitting element portion larger than the surface area of the other first external connection portions 21 allows the decrease in adhesion between the conductive layer 57 and the first electrodes 11, peeling of the conductive layer 57, and the like attributable to a small surface area to be effectively avoided.

Also, in the case where the conductive layer 57 is also formed on the second electrode 12, the second external connection portion 22 can also be formed at the same time on the second electrode 12. The second external connection portion 22 obtained here is preferably formed, for example, in a single straight line in the second direction of the light emitting element, but a plurality of them may be arranged in a straight line. In the case where the second external connection portion 22 is thus disposed in the second direction in plan view, the first external connection portions 21 and 21b are preferably formed so as to be disposed on both sides of the second external connection portion 22, sandwiching it in between.

Division

In the case where a plurality of semiconductor laminated bodies each constituting a single light emitting element are arranged in a matrix on the support substrate 15 (such as a wafer), and these are used as light emitting element portions, the semiconductor laminated bodies may be divided up as needed along with the support substrate, either in between the light emitting element portions or in groups of a plurality of light emitting element portions. This division can be accomplished by any method known in this field.

Embodiment 3: Light Emitting Element 20

Figure 3A:
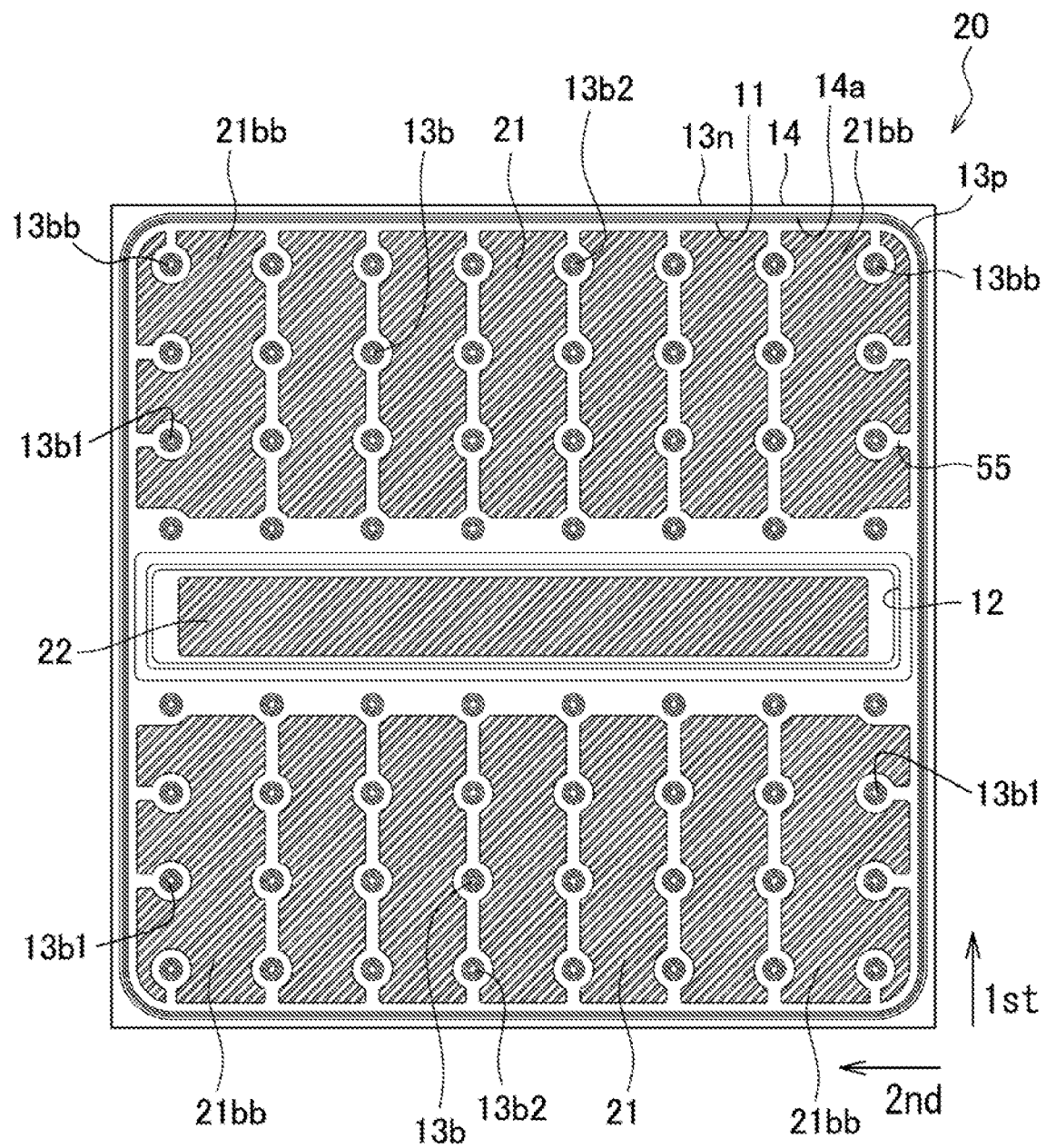
FIG. 3A is a plan view schematically showing the light emitting element according to another embodiment of the present disclosure.
Figure 3B:
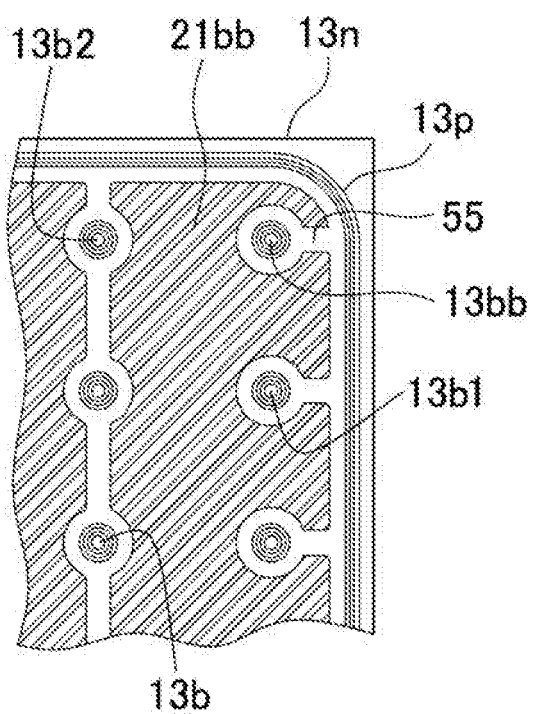
FIG. 3B is an enlarged plan view of a main part showing a modification of the light emitting element of FIG. 3A.

The light emitting element 20 shown in FIG. 3A is a modification example of the light emitting element 10 described above.

The light emitting element 20 in this embodiment has substantially the same configuration as that of the light emitting element 10, except that the first external connection portions 21 include the first external connection portions 21 that extend in the first direction in between the exposed portions 13b arranged in the first direction and the exposed portions 13b arranged in adjacent rows, as well as first external connection portions 21bb that surround part of the exposed portions 13b1 adjacent to the outer edge of the second semiconductor layer 13p in the first direction, and have grooves 55 that open in the second direction toward the outer edge of the second semiconductor layer 13p.

The first external connection portions 21*bb* have a larger surface area than the first external connection portions 21 in plan view. Also, the width of the grooves 55 is less than the width of the exposed portions 13*b* and 13*b*1 in plan view.

In the case where first external connection portions 21*bb* have the exposed portions 13*bb* closest to the corners of the second semiconductor layer 13*p*, the grooves 55 that open from these exposed portions 13*bb* may open along the first direction as shown to FIG. 3A. Also, as shown to FIG. 3B, all of the grooves 55 may open along the second direction.

In the case of manufacturing such a light emitting element, the shape of the mask may be altered so that the first electrodes corresponding to the grooves 55 are also covered in the mask formation step discussed above. That is, the mask may be formed so as to further cover a region extending along the second direction, from the exposed portion toward the outer edge of the second semiconductor layer in the first direction.

Embodiment 4: Light Emitting Element 30

Figure 4:
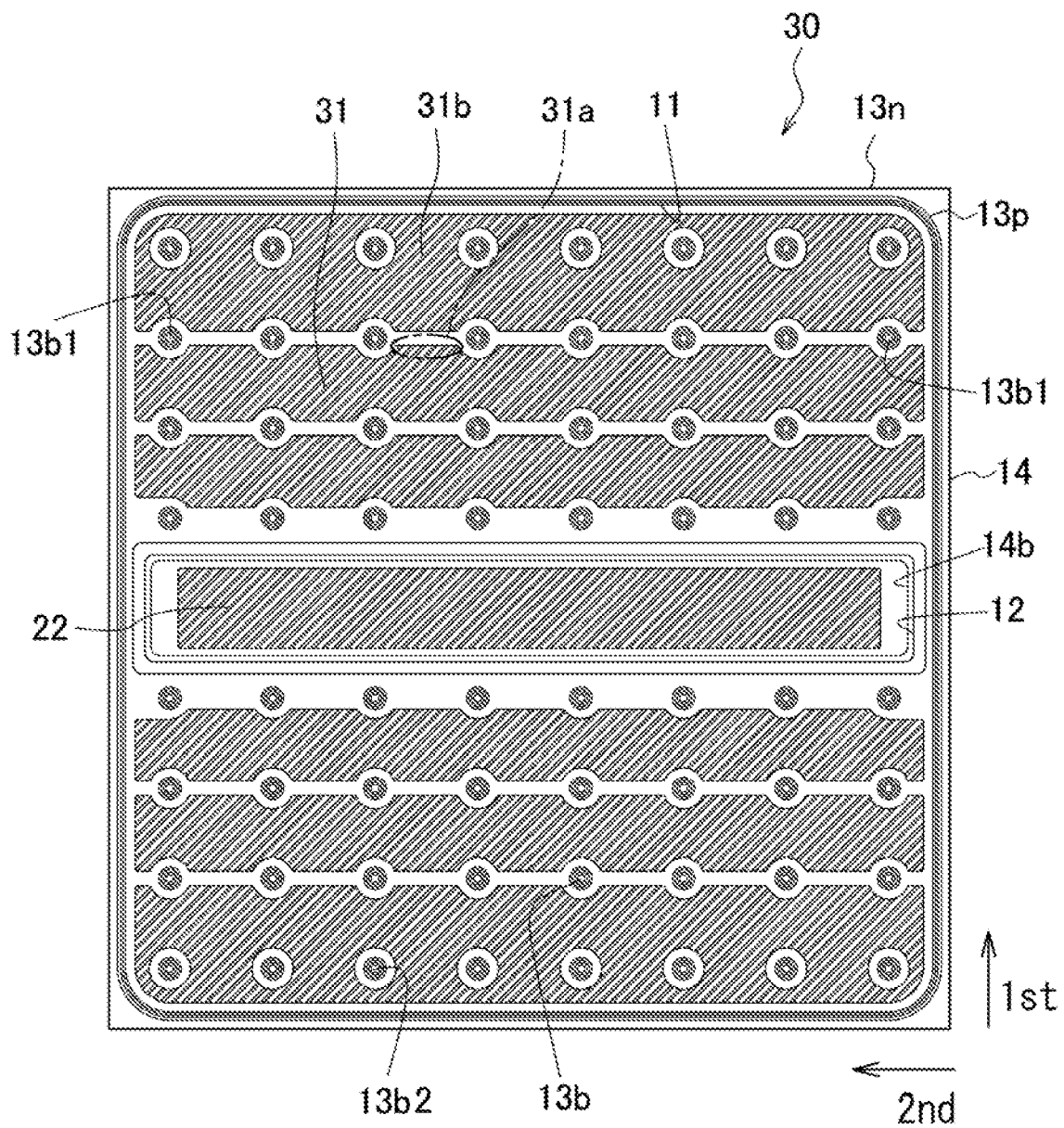
FIG. 4 is a plan view schematically showing the light emitting element according to still another embodiment of the present disclosure.

The light emitting element 30 shown in FIG. 4 is a modification example of the light emitting element 10 described above.

The light emitting element 30 in this embodiment has substantially the same configuration as that of the light emitting element 10, except that the first external connection portions are disposed in between the rows of the exposed portions 13*b* arranged in the second direction. In other words, the first external connection portions include first external connection portions 31 that are disposed in between the rows of the exposed portions 13*b* arranged in the second direction, and first external connection portions 31*b* that extend in plan view from a region Q of the semiconductor stacked body 13 to in between the rows of the exposed portions 13*b*2 arranged in the second direction, and that have a larger surface area than the first external connection portions 31.

At least part of the extensions 31*a* are preferably located between the exposed portions 13*b* that are adjacent in the second direction in plan view. The width of the extensions 31*a* (that is, their length in the second direction) is set such that the extensions 31*a* will be clear to the exposed portions 13*b* in between the exposed portions 13*b*, without causing any electrical short circuiting. The extensions 31*a* preferably extend in the first direction past the exposed portions 13*b*2, in between the exposed portions 13*b*2 of the exposed portions 13*b* disposed in a row in the second direction, which are disposed closest to the outer edge of the semiconductor stacked body 13.

In the case of manufacturing such a light emitting element, the shape of the mask may be altered in the mask formation step discussed above. More specifically, the plan view shape of the mask may be a shape that covers the exposed portions 13*b* and a region connecting in the second direction the exposed portions other than the exposed portions 13*b*2 closest to the outer edge in the second direction of the second semiconductor layer 13*p*.

Embodiment 5: Light Emitting Element 40

Figure 5A:
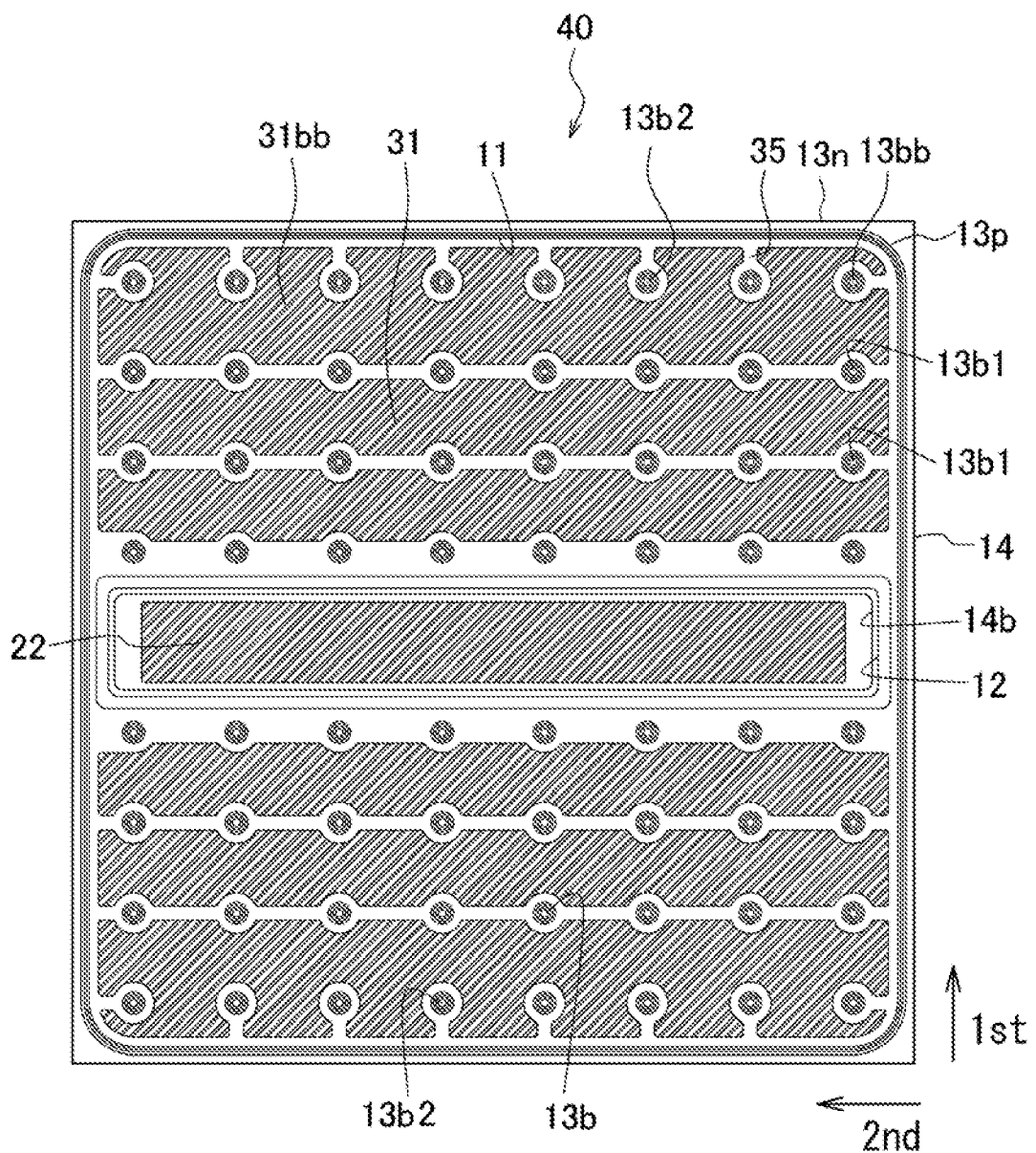
FIG. 5A is a plan view schematically showing the light emitting element according to still another embodiment of the present disclosure.

The light emitting element 40 illustrated in FIG. 5A is a modification example of the light emitting element 30 described above.

The light emitting element 40 in this embodiment has substantially the same configuration as that of the light emitting element 30, except that the first external connection portions include first external connection portions 31 that extend in the second direction in between the exposed portions 13*b* arranged along the second direction and the exposed portions 13*b* arranged in adjacent rows, and first external connection portions 31*bb* that have grooves 35 that surround part of the exposed portions 13*b*2 adjacent to the outer edge of the second semiconductor layer 13*p* along the second direction, and open along the first direction toward the outer edge of the second semiconductor layer 13*p*.

The first external connection portions 31*bb* have a larger surface area than the first external connection portions 31 in plan view.

Figure 5B:
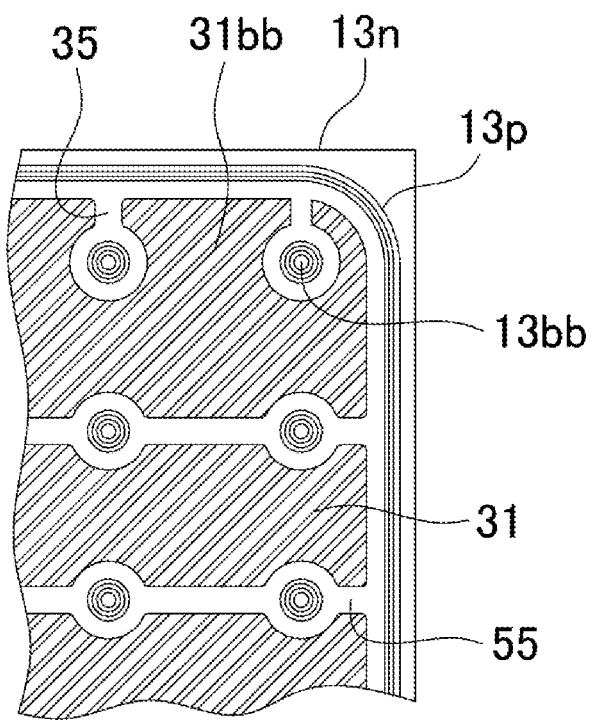
FIG. 5B is an enlarged plan view of a main part showing a modification of the light emitting element of FIG. 4A.

In the case where the first external connection portions 31*bb* have the exposed portions 13*bb* closest to the corners of the second semiconductor layer 13*p*, the grooves 35 that open from these exposed portions 13*bb* may be open along the second direction as shown in FIG. 5A, or may be open along the first direction as shown to FIG. 5B.

In the case of manufacturing such a light emitting element, the shape of the mask may be altered so that the first electrodes corresponding to the grooves 35 are also covered in the mask formation step described above.

Embodiment 6: Light Emitting Device 50

Figure 6A:
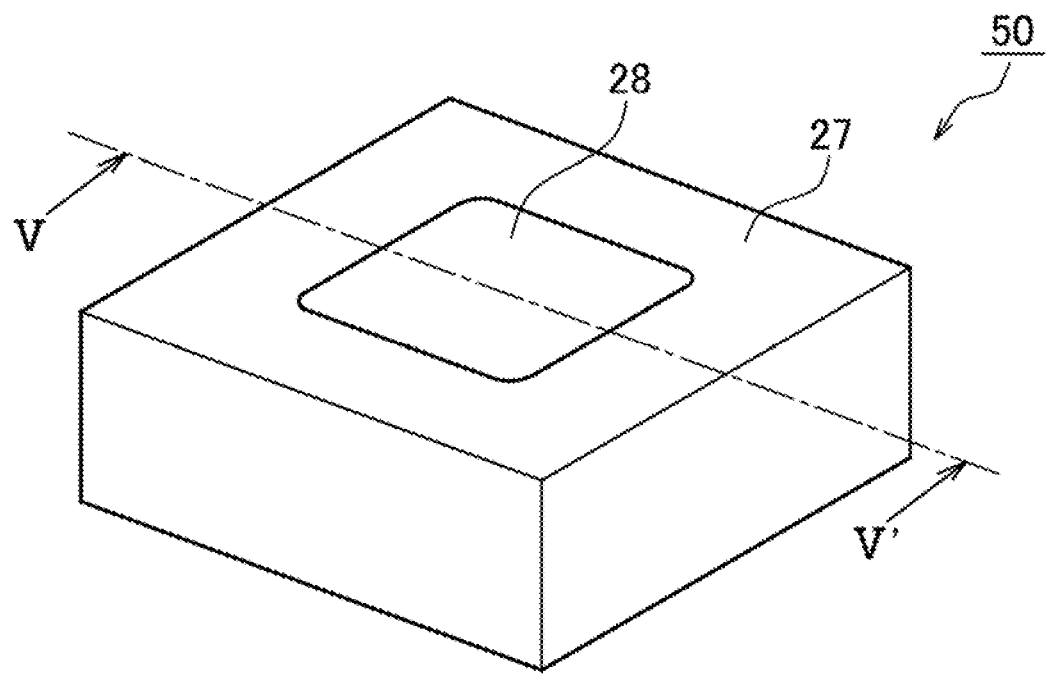
FIG. 6A is a plan view schematically showing the light emitting device according to an embodiment of the present disclosure.
Figure 6B:
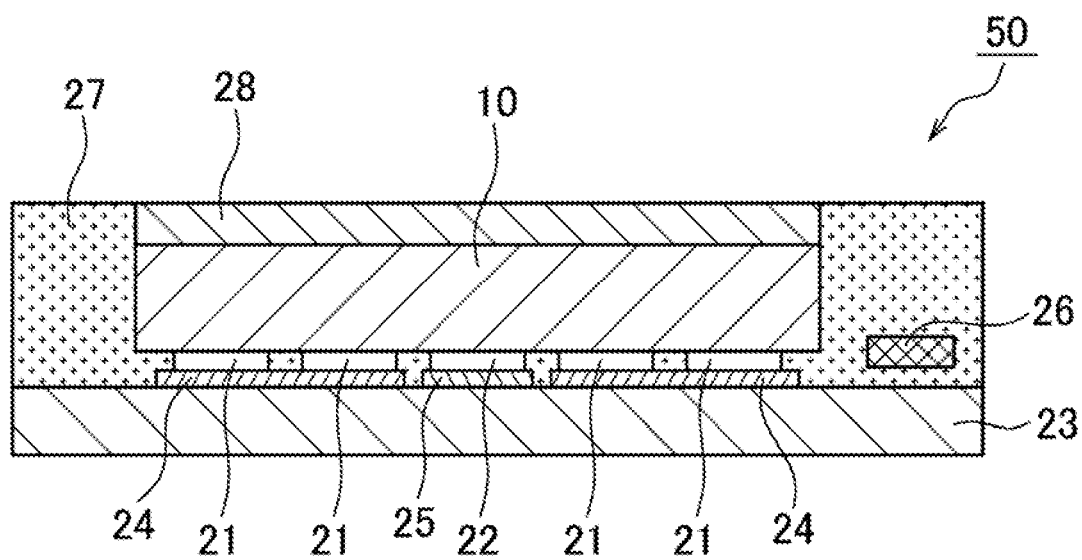
FIG. 6B is a cross-sectional view schematically showing the light emitting device taken along line V-V' in FIG. 6A.

As shown in FIGS. 6A and 6B, the light emitting device 50 in an embodiment of the present disclosure comprises the substrate 23 having a wiring pattern on its upper surface, the light emitting element 10 described above, and the cover member 27.

Substrate 23

The substrate 23 has wiring patterns 24 and 25 on its upper surface, and the light emitting element 10 is flip-chip mounted on the wiring patterns 24 and 25.

Examples of the material of the substrate include an insulating member such as glass epoxy, resin, and ceramic, and a metal member having an insulating member formed on the surface. Among these, the substrate material is preferably a material using ceramics having high heat resistance and weather resistance. Examples of the ceramic material include alumina and aluminum nitride.

The wiring patterns 24 and 25 may be ones that are able to supply current to the light emitting element 10, and are formed from a material and in a thickness, shape, and so forth that are normally used in this field. Specifically, the wiring patterns 24 and 25 can be formed of, for example, a metal such as copper, aluminum, gold, silver, platinum, titanium, tungsten, palladium, iron, nickel, or an alloy containing these metals. The outermost surface of the wiring patterns 24 and 25 formed on the upper surface of the substrate 23 is preferably covered with a highly reflective material such as silver or gold in order to efficiently extract light from the light emitting element 10. The wiring patterns 24 and 25 are formed by electroplating, electroless plating, vapor deposition, sputtering, or the like. For instance, in the case where the outermost surfaces of the first external connection portions 21 and the second external connection portion 22 connected to the wiring patterns 24 and 25 as the electrodes of the light emitting element 10 are formed from gold, the outermost surfaces of the wiring patterns 24 and 25 are also preferably gold. This improves joining between the light emitting element 10 and the substrate 23.

The wiring patterns 24 and 25 preferably have a wiring pattern 24 to which the first external connection portions 21 are connected, and a wiring pattern 25 to which the second external connection portion 22 is connected, on the upper surface of the substrate 23. These wiring patterns 24 and 25 allow the light emitting element 10 to be connected by flip-chip mounting. In the case where flip-chip mounting is performed on the substrate 23, with the lower surface serving as the surface on which the first external connection portions 21 and the second external connection portion 22 are formed, the upper surface on the opposite side from the lower surface becomes the main light extraction surface of the light emitting element 10. The wiring patterns 24 and 25 may be disposed not only on the upper surface of the substrate 23, but also in the interior and/or on the lower surface.

Between the first external connection portion 21 and the second external connection portion 22 in the light emitting element 10, and the wiring patterns 24, 25 can be bonded using, for example, an ultrasonic bonding method. Also, the bonding members can be used to bond between the first external connection portion 21 and the second external connection portion 22, and the wiring patterns 24, 25. The bonding member includes a bump formed of gold, silver, copper, etc., a metal paste containing metal powder such as silver, gold, copper, platinum, aluminum, palladium and resin binder, a solder such as tin-bismuth solder, tin-copper solder, tin-silver solder, gold-tin solder, and a brazing material such as low melting point metal, etc.

Cover Member 27

The cover member 27 covers the side surfaces of the light emitting element 10, the part between the light emitting element 10 and the substrate 23, the upper surface of the substrate 23, and the side surfaces of the first external connection portions 21 and the second external connection portion 22. The cover member 27 is preferably also disposed directly below the exposed portions on the lower surface of the light emitting element 10. As will be described below, in the case where the light emitting device 50 has a light transmissive member 28 on the upper surface of the light emitting element 10, the cover member 27 preferably also covers the side surfaces of the light transmissive member 28. The covering member 27 can be formed of a resin having light reflectivity, light transmissive properties, light shielding properties or the like, a resin containing a light reflective substance, a phosphor, a diffusing material, a colorant or the like in these resins. Especially, it is preferable that the covering member 27 has light reflectivity and/or light-shielding property. As the resin, the light reflective material and the like constituting the covering member 27, any of those usually used in the field can be used. For example, examples of the resin include a silicone resin, a modified silicone resin, an epoxy resin, a modified epoxy resin, a resin containing one or more of an acrylic resin, a hybrid resin and the like. Examples of the light reflecting material include titanium oxide, silicon oxide, zirconium oxide, potassium titanate, alumina, aluminum nitride, boron nitride, mullite and the like.

The material constituting the cover member 27 preferably includes a resin that has high fluidity and is cured by irradiation with heat or light, because this will allow the material to work its way in between the light emitting element 10 and the substrate 23 more easily, and will tend to prevent the generation of voids. Examples of such a material include those exhibiting fluidity at a viscosity of 0.5 Pa·s to 30 Pa·s. Also, the amount of reflected light, the amount of transmitted light, and so forth can be varied depending on the content of the light reflecting substance and the like in the material constituting the cover member 27. The cover member 27 preferably contains a light reflective material in an amount of at least 20% by weight, for example. The covering member 27 can be formed by, for example, an injection molding, a potting molding, resin printing method, a transfer molding method, a compression molding or the like.

Light Transmissive Member 28

The light emitting device 50 preferably has the light transmissive member 28 on the upper surface of the light emitting element 10. The light transmissive member 28 covers the light extraction surface of the light emitting element, and is a member capable of transmitting 50% or more, preferably 60% or more, more preferably 70% or more of the light emitted from the light emitting element 10 and emitting the light to the outside. The light transmissive member 28 can contain a light diffusing material and a phosphor that is capable of converting the wavelength of at least some of the light emitted from the light emitting element 10. It is preferable for the lower surface outer edge of the light transmissive member 28 to coincide with the upper surface outer edge of the light emitting element 10, or to be located only to the inside or outside of the upper surface outer edge. The light transmissive member 28 is preferably flat, and the thickness of the light transmissive member 28 is 50 μm to 300 μm, for example.

The light transmissive member 28 can be formed, for example, from resin, glass, an inorganic material, or the like. Examples of a light transmissive member containing a phosphor include a sintered phosphor, and a phosphor that has been added to a resin, glass, or another inorganic substance. Also, the light transmissive member 28 may be one in which a resin layer containing a phosphor is formed on the surface of a flat molded article made of resin, glass, or an inorganic material. The higher the transparency of the light transmissive member 28, the better light will be reflected at the interface with the cover member 27, so the luminance can be increased.

For example, in the case where a blue light emitting element or an ultraviolet light emitting element is used as the light emitting element 10, the phosphor contained in the light transmitting member 28 is a yttrium-aluminum-garnet phosphors (YAG: Ce) activated with cerium, a lutetium-aluminum-garnet-based phosphors (LAG: Ce) activated with cerium, nitrogen-containing alumino activated with europium and/or chromium Calcium silicate phosphor ($CaO\text{—}Al_2O_3\text{—}SiO_2$: Eu), silicate phosphor activated with europium ((Sr, Ba)$_2$SiO$_4$: Eu), β-sialon phosphor ($Si_{6-z}Al_zO_zN_{8-z}$: Eu) (0<Z<4.2)), a nitride phosphor such as CASN phosphor or SCASN phosphor, KSF-based phosphors ($K_2SiF_6$: Mn), sulfide phosphors, quantum dot phosphors and the like. In the case of combining these phosphors with a blue light emitting element or an ultraviolet light emitting element, a light emitting device having a desired light emission color (for example, a white light emitting device) can be obtained. In the case where such a phosphor is contained in the light transmitting member, the concentration of the phosphor is preferably about 5% to 50%, for example.

The light transmissive member 28 is joined so as to cover the light extraction surface of the light emitting element 10. The light transmissive member 28 and the light emitting element 10 can be joined with or without an adhesive. A resin material such as an epoxy or silicone can be used as the adhesive, for example. For joining the light transmissive member 28 and the light emitting element 10, a direct joining method using a pressure bonding, a sintering, a surface activation joining, an atomic diffusion joining, or a hydroxyl group joining may be used.

The light emitting device 50 may optionally include another element, electronic component, or the like, such as a protective element 26. These elements and electronic components are preferably embedded in the cover member 27.

Embodiment 7: Light Emitting Device 60

Figure 7:
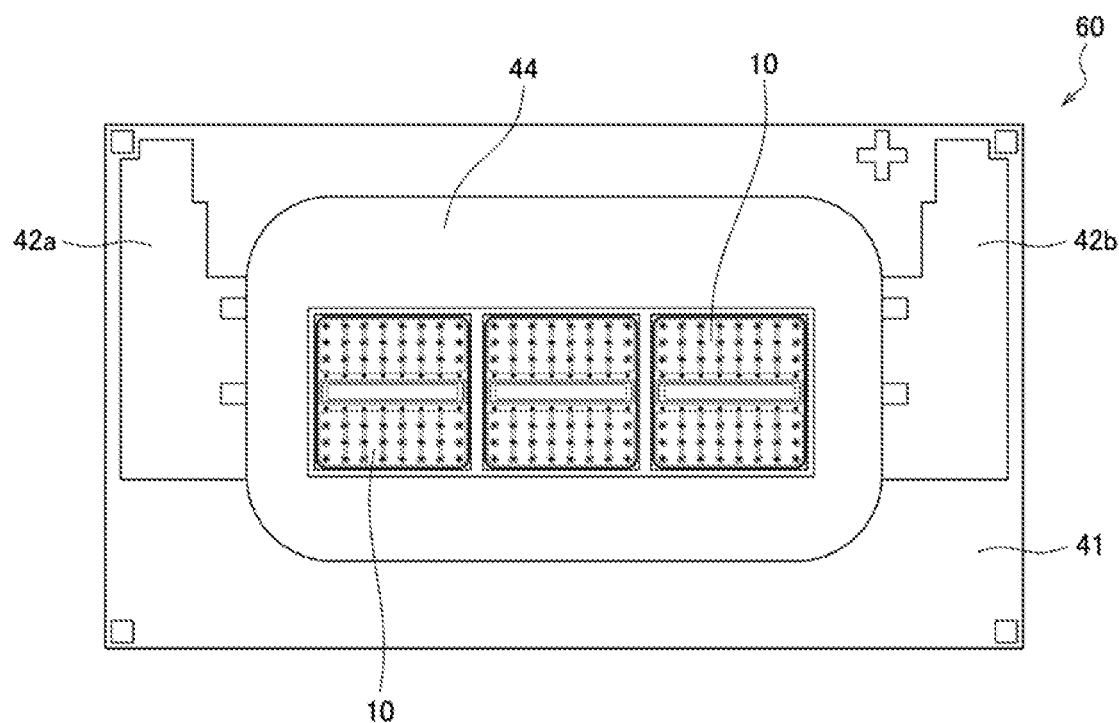
FIG. 7 is a plan view schematically showing the light emitting device according to another embodiment of the present disclosure.

As shown in FIG. 7, a light emitting device 60 in an embodiment of the present disclosure comprises a wiring substrate 41 having wiring patterns 42a and 42b on its upper surface, a plurality of (e.g., three) of the light emitting elements 10 described above, and a cover member 44.

In the case where the plurality of light emitting elements 10 are arranged in a row, the arrangement is preferably such that the first direction of the light emitting elements 10 is different from the direction in which the light emitting elements 10 are arranged, for example, a direction perpendicular to the direction in which the light emitting elements 10 are arranged. In the case where the plurality of light emitting elements 10 are arranged at a relatively narrow spacing, the cover member 44 cannot flow in from all directions of the light emitting elements 10, and it is difficult to dispose the cover member 44 directly below the light emitting elements 10. With the arrangement in this embodiment, the cover member 44 can flow in efficiently along the first direction of the light emitting elements 10. Therefore, the cover member 44 can easily fill in the space directly under all the exposed portions 13b of all the light emitting elements 10, and the light extraction efficiency can be improved.

A relay wiring pattern is provided between the wiring patterns 42a and 42b in the light emitting device 60. In the case where the emitting element 10 is mounted on this relay wiring pattern, in this embodiment three of the light emitting elements 10 are connected in series. Also, part of the wiring patterns 42a and 42b is covered by the cover member 44.

What is claimed is:
1. A light emitting element comprising:
   a semiconductor stacked body having
      a first semiconductor layer,
      a light emitting layer stacked on the first semiconductor layer, and
      a second semiconductor layer stacked on the light emitting layer,
      on a second semiconductor layer side of the semiconductor stacked body, the first semiconductor layer is exposed from the second semiconductor layer and the light emitting layer at a plurality of exposed portions, the exposed portions being disposed in a plurality of rows in plan view with each of the rows extending in a first direction and the rows being aligned along a second direction perpendicular to the first direction, and
      the semiconductor stacked body having an end region in which a spacing along the second direction between a first outer edge of the second semiconductor layer extending along the first direction and the exposed portions in an outermost one of the rows closest to the first outer edge of the second semiconductor layer is narrower than a spacing along the second direction between the exposed portions in adjacent ones of the rows;
   an insulating film covering the semiconductor stacked body and defining a plurality of openings respectively above the exposed portions;
   a first electrode connected to the exposed portions at the openings in the insulating film, the first electrode being partly disposed over the second semiconductor layer via the insulating film;
   a second electrode connected to the second semiconductor layer;
   a second external connection portion connected to the second electrode; and
   a plurality of first external connection portions connected to the first electrode, the first external connection portions being spaced apart from the exposed portions in the plan view with each of the first external connection portions extending in the first direction between corresponding adjacent ones of the rows of the exposed portions, the first external connection portions including at least one smaller-size first external connection portion disposed between adjacent ones of the rows of the exposed portions other than the outermost one of the rows, and at least one larger-size first external connection portion extending from the end region to at least a position between the outermost one of the rows and an adjacent one of the rows the exposed portions, the at least one larger-size first external connection portion has a larger surface area than the at least one smaller-size first external connection portion in the plan view.

2. The light emitting element according to claim 1, wherein
   the at least one larger-size first external connection portion surrounds the exposed portions in the outermost one of the rows in the plan view.

3. The light emitting element according to claim 1, wherein
   the at least one larger-size first external connection portion defines at least one first groove that extends in the second direction from one of the exposed portions in the outermost one of the rows toward the first outer edge of the second semiconductor layer in the plan view.

4. The light emitting element according to claim 3, wherein
   a width of the at least one first groove along the first direction is less than a width of the one of the exposed portions along the first direction in the plan view.

5. A light emitting device comprising:
   a substrate having a wiring pattern on an upper surface;
   the light emitting element according to claim 1, the light emitting element being flip-chip mounted on the wiring pattern; and
   a cover member containing a light reflecting material and covering the light emitting element, the first external connection portions, the second external connection portion and the substrate.

6. A light emitting device comprising:
   a substrate having a wiring pattern on an upper surface;
   the light emitting element according to claim 2, the light emitting element being flip-chip mounted on the wiring pattern; and
   a cover member containing a light reflecting material, and covering the light emitting element, the first external connection portions, the second external connection portion and the substrate.

7. A light emitting device comprising:
   a substrate having a wiring pattern on an upper surface;
   the light emitting element according to claim 3, the light emitting element being flip-chip mounted on the wiring pattern; and a cover member containing a light reflecting material, and covering the light emitting element, the first external connection portions, the second external connection portion and the substrate.

8. The light emitting element according to claim 1, wherein the at least one larger-size external connection portion defines at least one groove that extends in the first direction from one of the exposed portions in the outermost one of the rows closest to the first outer edge of the second semiconductor layer toward a second outer edge of the second semiconductor layer extending along the second direction, in plan view.

9. The light emitting element according to claim 3, wherein the at least one larger-size external connection portion defines at least one second groove that extends in the first direction from one of the exposed portions in the outermost one of the rows closest to the first outer edge of the second semiconductor layer toward a second outer edge of the second semiconductor layer extending along the second direction, in plan view.

10. The light emitting element according to claim 8, wherein a width of the at least one groove is less than a width of the exposed portion, in plan view.

11. The light emitting element according to claim 9, wherein a width of the at least one second groove is less than a width of the exposed portion, in plan view.

12. The light emitting element according to claim 9, wherein a number of the at least one first groove is more than a number of the at least one second groove.

13. The light emitting element according to claim 11, wherein a number of the at least one first groove is more than a number of the at least one second groove.

14. A light emitting device, comprising:

a substrate having a wiring pattern on an upper surface;

the light emitting element according to claim 9, the light emitting element being flip-chip mounted on the wiring pattern; and a cover member containing a light reflecting material and covering the light emitting element, the first external connection portions, the second external connection portion and the substrate.

* * * * *